United States Patent [19]
Wilson

[11] 3,786,279
[45] Jan. 15, 1974

[54] ADAPTIVE TRANSISTOR SWITCH

[75] Inventor: William J. Wilson, Chicago, Ill.
[73] Assignee: Motorola, Inc., Franklin Park, Ill.

[22] Filed: May 30, 1972
[21] Appl. No.: 258,027

[52] U.S. Cl. .................. 307/254, 307/297
[51] Int. Cl. .................. H03k 17/60
[58] Field of Search .................. 307/254, 297

[56] References Cited
UNITED STATES PATENTS

| | | | |
|---|---|---|---|
| 3,319,150 | 5/1967 | Elich et al. | 307/297 X |
| 3,483,464 | 12/1969 | Embree et al. | 307/297 X |
| 2,888,633 | 5/1959 | Carter | 307/297 X |

*Primary Examiner*—John Zazworsky
*Attorney*—Vincent Rauner et al.

[57] ABSTRACT

A transistor switch connecting a load to a suitable source of power with amplifying means supplying base current to the transistor switch with a voltage sensitive device, such as a diode or a transistor, connected to sense the voltage across the transistor switch and provide an alternate path for driving current to the amplifier to maintain base current into the transistor switch at a predetermined ratio relative to current flowing through the transistor switch and the load.

7 Claims, 3 Drawing Figures

ADAPTIVE TRANSISTOR SWITCH

BACKGROUND OF THE INVENTION

1. Field of the Invention

In most electronic circuits utilizing semiconductor devices, such as transistors, for the switching device, the transistor must operate in a saturation mode to ensure proper switching and maximum transmission of power to the load. However, variations in the load or power supply will cause variations in the current passing through the transistor and, if these variations are sufficiently large, may cause the transistor to conduct below saturation.

2. Description of the Prior Art

In prior art switching circuits, foreseeable variations of the load and transistor current are predicted and base current for the transistor is maintained at a sufficiently high value to cause the transistor to operate in saturation even though the load drops substantially. However, this means that substantial excess current is flowing into the base when the load is normal or above normal. The excess current flowing into the base of the transistor is wasted since it provides no useful function.

SUMMARY OF THE INVENTION

The present invention pertains to an improved semiconductor switching circuit wherein transistor means are connected to control the current from a suitable source of power through a load and circuitry is connected to a base of the transistor means, which circuitry senses the voltage drop across at least a portion of the transistor means and provides an alternate current path to alter the base current so that the base current and the collector current of the transistor means are maintained substantially at a predetermined ratio.

It is an object of the present invention to provide an improved semiconductor switching circuit.

It is a further object of the present invention to provide an improved semiconductor switching circuit wherein amplifying means supplies base current to the transistor switch and voltage sensing means sense the voltage drop across the switch and provide an alternate path for driving current into the amplifying means in response to the voltage sensed.

It is a further object of the present invention to provide an improved semiconductor switch wherein the base current applied to the switch and the collector current flowing through a variable load are maintained at substantially a predetermined ratio.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
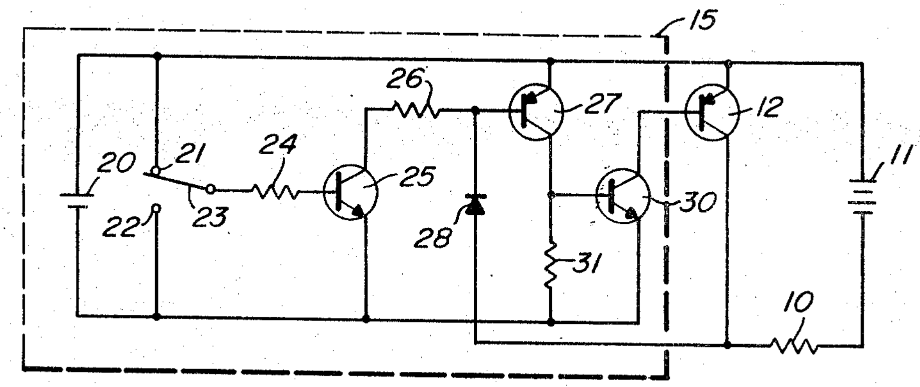
FIG. 1 is a schematic diagram of a simplified, improved semiconductor switching circuit.

Referring specifically to FIG. 1, one end of a load 10 (illustrated as a simple resistor) is connected to the negative terminal of a suitable source of power 11 and the other end is connected to the collector of a PNP type transistor 12. The emitter of the transistor 12 is connected to the positive terminal of the voltage source 11 and the base is connected to circuit means generally designated 15, which will be explained in detail presently. While the single transistor 12 is utilized to connect the load 10 to the source 11 in the present embodiment, it should be understood that a variety of semiconductor means might be utilized as the semiconductor switch to control current flow through the load 10.

In this embodiment the circuit means 15 includes a suitable source of power 20 having a first stationary contact 21 of a switch connected to the positive terminal and a second stationary contact 22 of the switch connected to the negative terminal. A movable contact 23 of the switch is connected to one end of a resistor 24, the other end of which is connected to the base of an NPN type transistor 25. The emitter of the transistor 25 is connected to the negative terminal of the source 20 and the collector is connected through a resistor 26 to the base of a PNP type transistor 27. The cathode of a diode 28, the anode of which is connected to the collector of the transistor 12, is also connected to the base of the transistor 27. The emitter of the transistor 27 is connected to the positive terminal of the source 20. The collector of the transistor 27 is connected to the base of an NPN type transistor 30 and through a resistor 31 to the negative terminal of the source 20. The emitter of the transistor 30 is connected to the negative terminal of the source 20 and the collector is connected to the base of the transistor 12.

In the operation of the circuit of FIG. 1, when the movable contact 23 of the switch is engaged with the stationary contact 22 a negative signal is applied to the base of the transistor 25 and transistor 25 is nonconducting. Thus, transistors 27, 30 and 12 are also nonconducting and no current is applied to the load 10. When the movable contact 23 is engaged with the stationary contact 21 a positive signal is applied to the base of the transistor 25 biasing the transistor into a conducting state and completing a path for base current from the transistor 27. Transistor 27 begins to conduct raising the voltage applied to the base of transistor 30 and biasing transistor 30 into conducting state so that transistor 12 may conduct current to the load 10. As transistor 12 saturates the voltage drop thereacross becomes relatively small and the voltage at the collector approaches the voltage of the positive terminals of either the source 11 or 20. This voltage is present on the anode of the diode 28. The voltage present on the cathode of the diode 28 is equal to the voltage at the positive terminal of either source 20 or 11 minus the voltage drop from emitter to base of transistor 27. Transistors 27 and 12 and diode 28 are chosen so that the voltage drop from emitter to base of the transistor 27 exceeds the voltage drop across the diode 28 and the voltage drop from collector to emitter of the transistor 12 (when the transistor 12 is saturated). Thus, diode 28 is forward biased and conducts current from the transistor 12 through the resistor 26 to the collector of the transistor 25. The transistor 25 is biased to conduct only a predetermined amount of current and current passing through the diode 28 replaces base current flowing in the transistor 27, or provides an alternate path for the base current of transistor 27. Reducing the amount of base current flowing in transistor 27 reduces the conduction thereof, which reduces the conduction of the transistor 30 and reduces the base current flowing in the transistor 12.

If current flow through the diode 28 reduces the base current in transistor 27 to a point at which transistor 12 begins to conduct below saturation, the voltage drop across transistor 12 increases thereby reducing the voltage applied to the anode of the diode 28 and reducing the conduction therethrough. Thus, more current is available at the base of the transistor 27 and transistor 12 receives more base current to move it back into saturation. In a similar fashion, any change in size of the load 10 or changes in the power supplied by the source 11 will cause a change in the current flowing in the transistor 12. The collector current flowing through the transistor 12 will be adjusted by the current flowing in the diode 28 so that the ratio of the collector to the base current in the transistor 12 will remain at substantially a predetermined value.

The diode 28 is a voltage sensitive device which responds to the voltage on the collector of transistor 12 to maintain the transistor 12 operating in saturation. When the circuit means 15 attempts to supply additional base current to the transistor 12 to drive it further into saturation the diode 28 provides an alternative path for base current to prevent this action. Because the diode 28 is taking base current from the transistor 27 and because transistors 27 and 30 form an amplifying means, taking a small amount of base current from the transistor 27 results in the removal of a large amount of base current from the transistor 12. Thus, excess base current, which is normally wasted when applied to transistor 12, can be removed by removing a small amount of base current from the transistor 27 and thereby increasing the efficiency of the circuit.

Figure 2:
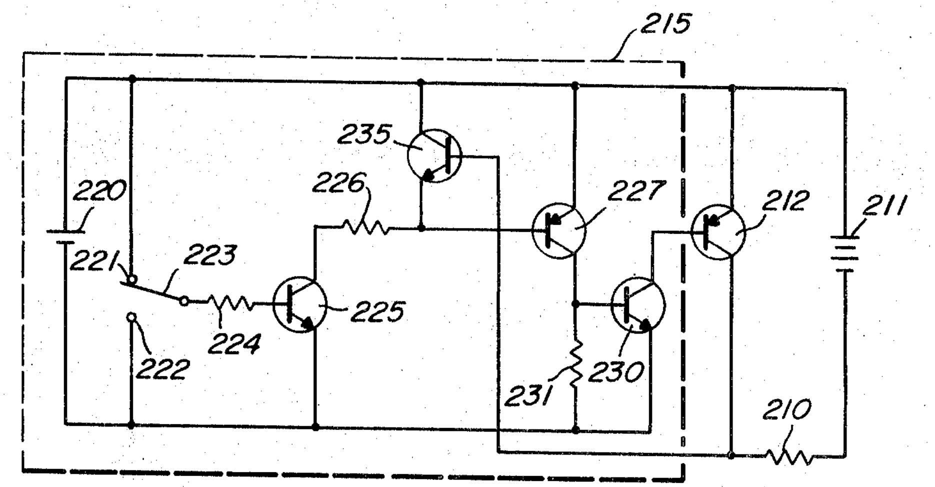
FIG. 2 is a schematic diagram of another embodiment of an improved semiconductor switching circuit, in simplified form.

Referring to FIG. 2, similar components are designated with similar numbers and all numbers have a prefix 2 added to indicate a different embodiment. Either electrode of a power source 220 is connected through a movable contact 223 of a two-position switch and a resistor 224 to the base of a transistor 225. The transistor 225 provides a base current path for a transistor 227 through a resistor 226. The collector of the transistor 227 is connected to the base of a transistor 230 so that conduction of transistor 227 causes conduction of the transistor 230. The transistor 230 forms a path for base current for a switching transistor 212, which connects a suitable power source 211 to a load 210. The above circuitry operates in a manner described in conjunction with similar circuitry illustrated in FIG. 1. The emitter of an NPN type transistor 235 is connected to the base of the transistor 27 and the collector is connected to the positive terminal of the voltage source 220. The base of the transistor 235 is connected to the collector of the transistor 212 so that the transistor 235 is sensitive to changes in the voltage drop across the transistor 212.

The transistor 235 forms an alternate path for current flowing through the transistor 225 and, thus, replaces or provides an alternate path for the base current of transistor 227. As the voltage drop across the transistor 212 increases the voltage at the base of the transistor 235 decreases and the transistor 235 conducts less. With the transistor 235 conducting less more of the current flowing through the transistor 225 is available at the base of the transistor 227 and conduction of the transistor 227 increases. Increasing the conduction of the transistor 227 increases the conduction of the transistors 230 and 212, thereby, causing the voltage drop across the transistor 212 to decrease. The transistor 235 has some amplification, in addition to the amplification supplied by transistors 227 and 230, so that a relatively small amount of current is utilized to maintain the transistor 212 operating at a predetermined point of saturation.

Figure 3:
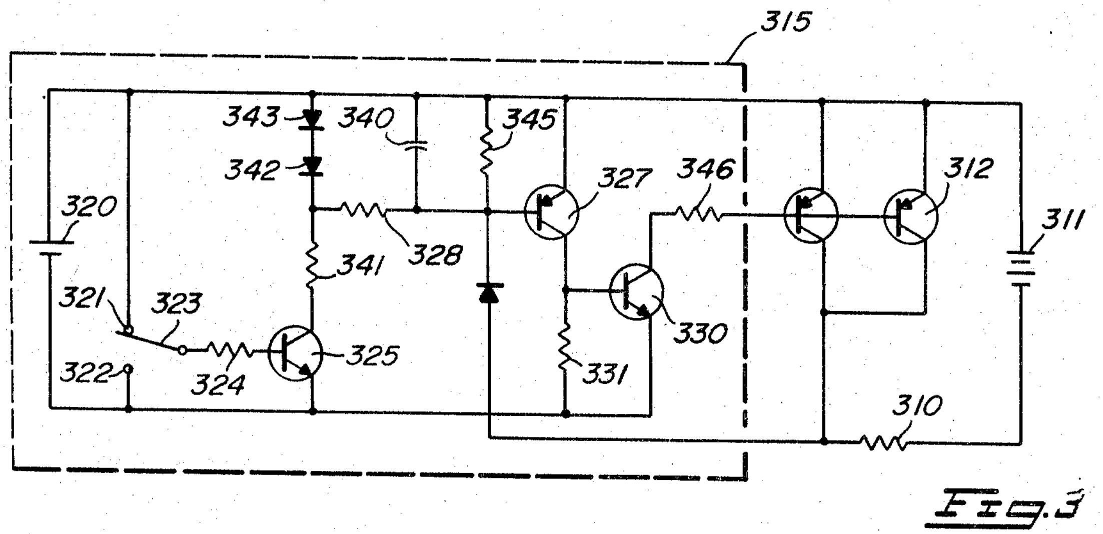
FIG. 3 is a schematic diagram of an improved semiconductor switching circuit, similar to FIG. 1, containing additional components.

Referring to FIG. 3, in circuit similar to FIG. 1 is illustrated with some additional components added to improve certain operating characteristics. Components of FIG. 3 which are similar to FIG. 1 are designated with similar numbers and all of the numbers have a prefix 3 added to indicate the different embodiment. In this embodiment transistor 312 consists of two transistors arranged n parallel to provide additional current carrying capacity. A capacitor 340 is connected from the positive terminal of the source 320 to the base of the transistor 327 to prevent oscillation at higher load supply voltages (generally greater than 20 volts). A resistor 341 is connected between the collector of the transistor 325 and the resistor 326 and a pair of diodes 342 and 343 are connected between the junction of the resistors 326 and 341 and the positive terminal of the voltage source 320. The diodes 342 and 343 and the resistor 341 are added to improve performance when the voltage of the supply 320 exceeds approximately 1.5 volts. A resistor 345 is connected between the base of the transistor 327 and the positive terminal of the source 320 to prevent leakage currents from flowing in the base of the transistor 327 when the movable arm 323 of the switch is engaged with stationary contact 322. A resistor 346 is connected between the collector of the transistor 330 and the common bases of the parallel pair of transistors 312 to limit the maximum current that can be conducted from the bases of the parallel transistors 312 to prevent damage to the circuit if the load 310 is momentarily shorted. While the additional components described are included to render the simplified circuit of FIG. 1 more practical under differing operating conditions, it should be understood that those skilled in the art may devise additional alterations and improvements.

Thus, improved switching circuitry is disclosed wherein semiconductor means are utilized to switch current from a suitable power source through a load. Circuitry associated with the semiconductor means provide only sufficient control current to the semiconductor means to maintain the semiconductor means operating in a predetermined saturated mode. Thus, excess control current normally wasted in prior art circuits is controlled or varied in the present circuit to increase the efficiency of the circuit and reduce the power consumption.

While I have shown and described specific embodiments of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. An improved semiconductor switching circuit for variable loads and the like comprising:
a. semiconductor means adapted to be connected to a load and a suitable source of power so as to conduct electric current from the source to the load;
b. means connected across said semiconductor means and sensitive to the voltage drop across said semiconductor means; and
c. circuit means having first and second modes of operation and including amplifying means connected to receive a driving current during the first mode of operation and coupled to said semiconductor means and to said voltage sensitive means for providing control current to said semiconductor means, said circuit means maintaining said semiconductor means nonconducting in the first mode of operation and providing control current to maintain said semiconductor means saturated in the second mode of operation, and said voltage sensitive means controlling an alternate path for the driving current supplied to said amplifying means during saturated operation of said semiconductor means to maintain the control current being applied to the semiconductor means and the current flowing through the semiconductor means at a predetermined ratio.

2. An improved semiconductor switching circuit as set forth in claim 1 wherein the semiconductor means includes at least one transistor.

3. An improved semiconductor switching circuit as set forth in claim 2 wherein the circuit means is connected to the base of the transistor to apply control current to the base and collector current of the transistor is adapted to flow through the load.

4. An improved semiconductor switching circuit as set forth in claim 3 wherein the voltage sensitive driven means is connected to the amplifying means to provide an alternate path for the driving current to the amplifying means.

5. An improved semiconductor switching circuit as set forth in claim 4 wherein the voltage sensitive means includes a diode connected to increase the driving current when the voltage drop across the transistor increases.

6. An improved semiconductor switching circuit as set forth in claim 4 wherein the voltage sensitive means includes a transistor connected to increase the driving current when the voltage drop across the transistor increases.

7. An improved method of controlling current through a variable load comprising the steps of:
a. connecting transistor means to said load and a suitable current source so that load current flows through said transistor means in a saturated mode of operation and substantially no load current flows through said transistor means in a nonconducting mode;
b. sensing the voltage drop across said transistor means during the saturated mode of operation;
c. supplying base current to said transistor means through amplifying means having an input with driving current applied thereto; and
d. providing an alternate path for a variable portion of the driving current in response to the voltage drop sensed across said transistor means, said alternate path receiving a smaller amount of driving current as the voltage drop increases for maintaining the load current flowing through said transistor means and the base current applied to said transistor means at a predetermined ratio.

* * * * *